US006229349B1

(12) United States Patent
Franckart et al.

(10) Patent No.: US 6,229,349 B1
(45) **Date of Patent: *May 8, 2001**

(54) AC INPUT CELL FOR DATA ACQUISITION CIRCUITS

(75) Inventors: Jean-Pierre Franckart, Montignies-sur-Sambre; Henri Husson, Wanfercee-Baulet, both of (BE)

(73) Assignee: GEC Alsthom Acec Transport S.A., Charleroi (BE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/952,362

(22) PCT Filed: Apr. 12, 1996

(86) PCT No.: PCT/BE96/00040

§ 371 Date: Jun. 8, 1998

§ 102(e) Date: Jun. 8, 1998

(87) PCT Pub. No.: WO96/33086

PCT Pub. Date: Oct. 24, 1996

(30) Foreign Application Priority Data

Apr. 19, 1995 (EP) .................................................. 95870039

(51) Int. Cl.⁷ .................................................. H03K 5/1536

(52) U.S. Cl. .................................................. 327/77; 327/80

(58) Field of Search ................................ 327/514, 72, 74, 327/77, 80, 81, 531, 447

(56) References Cited

U.S. PATENT DOCUMENTS 4,091,292 5/1978 Sibley .................................. 307/130
4,712,153 * 12/1987 Marget et al. ......................... 361/91
5,621,394 * 4/1997 Garrick et al. ....................... 340/628

FOREIGN PATENT DOCUMENTS 0 183 406 A1 11/1985 (EP) .

* cited by examiner

*Primary Examiner*—Tuan T. Lam
(74) *Attorney, Agent, or Firm*—Knobbe Martens; Olsen & Bear, LLP

(57) ABSTRACT

The present invention relates to an AC input cell for data acquisition circuits, comprising at least one circuit for detecting a voltage greater than the reference for the positive half-cycle at the input voltage, and a device for detecting a voltage greater than the reference for the negative half-cycle of the input voltage. Each detection circuit comprises a Zener diode, an optocoupler including an emission LED, a diode and a resistor arranged in series. Each detection circuit is arranged on a branch, and the two branches are in parallel with the devices arranged in opposite directions so that the two circuits conduct on alternate half cycles of the input AC signal.

6 Claims, 3 Drawing Sheets

AC INPUT CELL FOR DATA ACQUISITION CIRCUITS

SUBJECT OF THE INVENTION

The present invention relates essentially to an AC input cell intended for data acquisition circuits, more particularly in railway applications.

TECHNICAL BACKGROUND

Currently, AC input cells intended for data acquisition circuits essentially consist of mechanical safety relays which are connected together by simple cabling.

OBJECTS OF THE INVENTION

The present invention aims to provide a cell for AC inputs intended for data acquisition circuits, particularly in railway applications, which has at least equivalent behaviour in terms of safety to that of the prior art, while keeping inherent advantages of compactness, easier maintenance and fitting as well as greater longevity.

More particularly, the present invention aims to provide a cell in which misreading always errs on the side of safety.

The present invention also aims to detect malfunctions which may occur in the various constituent elements of the cell.

The present invention furthermore aims to minimize the influence of a variation in the characteristics of the components which are used, under the effect of an external factor such as a rise in temperature, for example.

PRINCIPLE CHARACTERISTICS OF THE PRESENT INVENTION

The present invention relates to an AC input cell intended for data acquisition circuits, comprising at least one device for detecting a voltage greater than the reference for the positive half-cycle at the input voltage, and a device for detecting a voltage greater than the reference for the negative half-cycle of the input voltage.

Each of these detection devices comprises a Zener diode, an optocoupler comprising an emission LED, a diode and a resistor, these elements being arranged in series.

According to a first preferred embodiment of the present invention, the elements constituting each of the two detection devices mentioned above are arranged on one branch, the two branches being arranged in parallel.

In this case, the elements constituting the detection device for the negative half-cycle are arranged in a configuration which is the opposite to that of the ones constituting the detection device for the positive half-cycle.

According to another embodiment, the two detection devices are arranged in series on a single branch. In this case, the elements constituting the detection device for the negative half-cycle are mounted in a configuration which is the opposite to that of those constituting the detection device for the positive half-cycle.

Particularly advantageously, a resistor is arranged in parallel on each of the optocouplers, so as to make it possible to limit the influence of the leakage current of the Zener diodes.

BRIEF DESCRIPTION OF THE FIGURES

The present invention will be described in more detail with the aid of the following figures.

DESCRIPTION OF SOME PREFERRED EMBODIMENTS OF THE INVENTION

In order to understand the principles underlying the design of the device according to the present invention, reference will be made essentially to FIGS. 1 and 2 which incorporate the principle characteristic elements.

Figure 1:
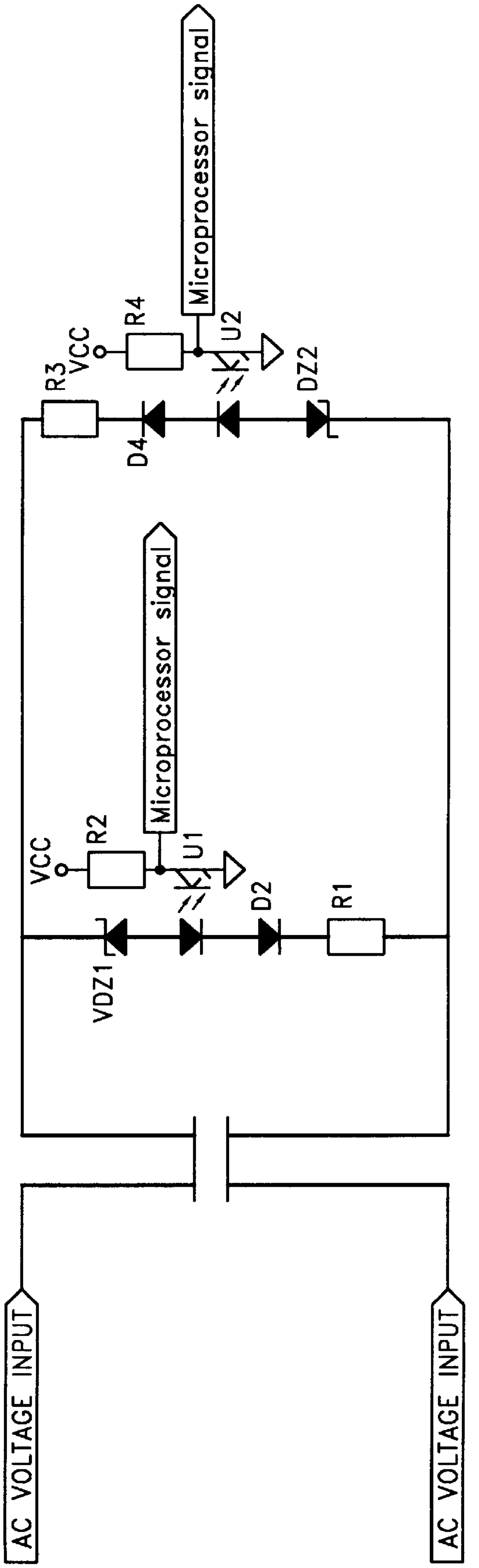
FIGS. 1 and 2 represent outline diagrams which show the essential elements constituting a device according to the present invention.

The device according to the present invention, commonly referred to as an AC input cell for data acquisition circuits, as represented in FIG. 1 is essentially composed of two branches, referred to as branches A and B, which respectively comprise a device for detecting a voltage higher than the reference for the positive half-cycle at the input voltage (branch A) and a device for detecting a voltage higher than the reference for the negative half-cycle of the input voltage (branch B).

In general, the voltage thresholding is carried out by measuring the time for which, during one half-cycle, the input voltage is greater than the reference voltage. If this time is greater than the predefined limit time, then the input voltage is considered as sufficient; otherwise, it is considered that there is not a sufficient voltage at the input.

The branches A and B comprise the same elements, but arranged in an opposite configuration. The branch A, which constitutes the detection device for the positive half-cycle, comprises a Zener diode DZ1, an optocoupler U1, a diode D2 and a resistor R1, these elements being arranged in series; whereas the branch B which constitutes the detection device for the negative half-cycle comprises a Zener diode DZ2, an optocoupler U2, a diode D4 and a resistor R3, also arranged in series but in the opposite configuration.

Figure 2:
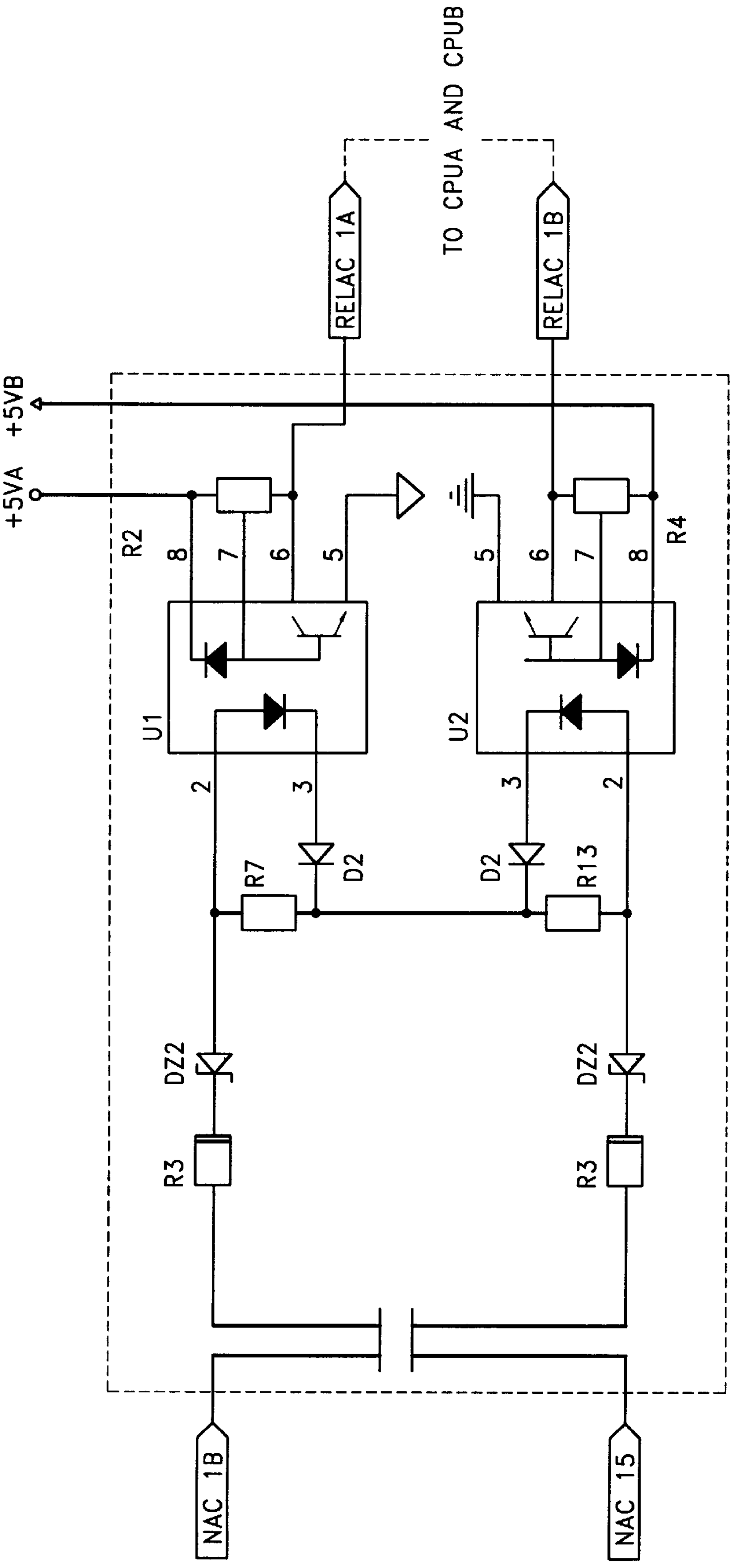

According to a preferred embodiment, represented in FIG. 2, it is conceivable for all the elements represented on the branches A and B in FIG. 1 to be arranged on a single branch, the two series of elements—Zener diode DZ1, optocoupler U1 and Zener DZ2, optocoupler U2—being arranged in opposite configurations.

The main drawback of this configuration described in FIG. 2 resides in the fact that the Zener diodes DZ1 and DZ2 may have a particularly large leakage current which increases with temperature.

Advantageously, in order to solve this problem, a resistor R7 or R13 is arranged in parallel on the LEDs of the optocouplers U1 and U2.

It is also conceivable for another element, having the same function, to be arranged in parallel with U1 or U2. However, a resistor seems to be the element with the most reliable and simplest design.

This device has the essential advantage of obtaining current thresholding.

Another advantage of this arrangement is a saving in volume and an increase in safety.

Figure 3:
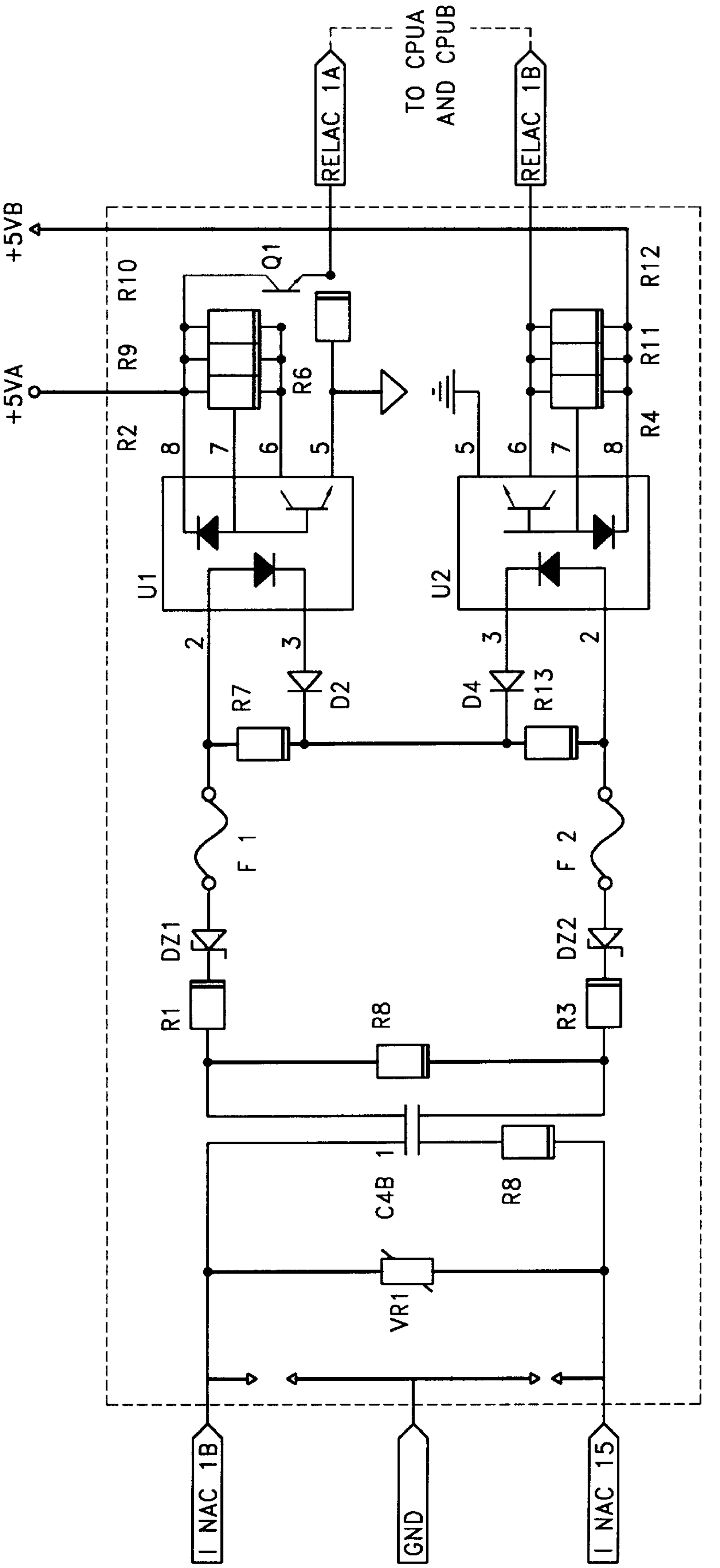
FIG. 3 represents an embodiment of the device according to the present invention implemented by applying the principles described in FIGS. 1 and 2.

FIG. 3 describes a practical example of a device according to the present invention, using the principles described in FIG. 2.

The device described in FIG. 3 is a 110 volt—50 hertz AC input cell, essentially comprising 3 functional units arranged in cascade.

The first unit (unit I) essentially makes it possible to limit overvoltages.

The second unit (unit II) guarantees consumption of the input power.

The third unit (unit III) performs the voltage thresholding of the cell, as well as the DC isolation between the input and the output processing lines.

The unit I consists of a varistore VR1, a resistor R5, diodes and spark gaps with a view to protecting the cell from overvoltages, whereas the unit II which ensures the minimal rated consumption (reactive power) consists of a "4 terminal" capacitor C4 coupling the input terminals of the cell to the unit III which itself provides the voltage thresholding.

The varistore VR1 clips the overvoltages occurring during differential discharges, while the resistor R5 limits the amplitude of the current peaks in the "4 terminal" capacitor C4 during the discharges, as well as the dV/dt.

The "4 terminal" capacitor C4 should be designed so as to ensure minimal consumption for a given 50 hertz input voltage.

The device for detecting a voltage higher than the reference for the positive half-cycle of the input voltage, this device being located on branch A, essentially consists of the elements described in FIGS. 1 and 2: the Zener diode DZ1, the optocoupler U1, the diode D2 and the resistor R1, while the device for detecting a voltage higher than the reference for the negative half-cycle of the input voltage, which device is located on branch B, essentially consists of the same elements as the ones described in FIGS. 1 and 2: the Zener diode DZ2, the optocoupler U2, the diode D4 and the resistor R3.

Furthermore, a fuse F1 or F2 is present in each of the branches A or B.

The principle selection criterion for the two main optocouplers U1 and U2 is that of operating with the lowest possible LED current, in order to make it possible to dissipate the minimum amount of power in the series resistors R1 and R3. This also makes it possible to minimize the contribution of the characteristic of the emission LED in the value of the voltage threshold.

The conduction time of the optocouplers U1 and U2 is measured by sampling, 32 times at regular intervals of 20 milliseconds (therefore corresponding to a frequency of 50 hertz), the electrical level delivered to the output processing lines and by counting the number of samples for which there is a logic state "0".

The emission LED of U1 emits throughout the time when the input voltage is higher than the threshold voltage of the branch A. The emission of this LED of the optocoupler U1 entails earthing of the resistors R2, R9 and R10 arranged in "pull up" on the optocoupler U1, thus leading to Q1 being turned off and to the reading of a "0" logic level on the input of the multiplexer scanned by the processing line A (Q1 emitter).

The emission LED of U2 emits throughout the time when the input voltage is higher than the threshold voltage of the branch B. The emission of this LED of the optocoupler U2 entails earthing of the resistors R4, R11 and R12 arranged in "pull up" on the optocoupler U2, thus leading to the reading of a "0" logic level on the input of the multiplexer scanned by the processing line B (collector of the output transistor of U2).

There are two safety criteria guaranteed for 110 volt AC input cells:

the detection threshold must not fall below a limit for a 50 hertz sinusoidal voltage;

the power consumed under a 50 hertz sinusoidal voltage for an input in the logic state 1 cannot fall below a second limit value.

It should be noted that, apart from the 4 terminal capacitor, the components used to produce an AC input cell have no other intrinsic guarantee of safety. For this reason, safety needs to rely on the use of the redundancy and checking the coherence of the data provided to the processing lines.

In particular, processing line A scans the voltage on the emitter Q1, while line B is connected to the collector of the output transistor of the optocoupler U2. At the end of each scanning cycle, A and B exchange, for mutual verification purposes, their own value for the number of samples taken when U1 or U2 were conducting.

The useful signals at the output of the cell are naturally presented on the collectors of the output optocouplers with a high output impedance level for the "1" electrical state and a low impedance level for the "0" electrical state. One precaution then consists in using, just for the processing line A, a buffer stage with transistor inverting the level of the output impedances so that there is this time a low impedance level for the "1" electrical state and a high impedance level for the "0" electrical state.

This characteristic has the risk of producing an "OR" logic function (as regards the state of the inputs) for the two processing lines in the event of defects consisting in the occurrence of a short-circuit between the output signals of the various cells.

This buffer stage consists of the transistor Q1 and the resistor R6 which are placed in the processing line A.

By thus creating an asymmetry between the two lines, in the event of multiple parasitic conducting circuits occurring, possibly affecting the same cells for the two processing lines, the following behaviour is profited from: the equivalent of a wired OR function (at the electrical level) is produced on the cells of line A, while the equivalent of a wired AND (at the electrical level) is produced on the cells of line B.

This leads to a divergence between processing lines being detected as soon as the two cells affected by the parasitic conducting circuits are in different states.

What is claimed is:

1. An AC input cell, comprising:

a first node;

a second node;

a first line coupled between said first node and said second node, said first line comprising a zener diode, an opto coupler comprising an LED diode, a diode and a resistor, each being arranged in series; and a second line coupled between said first node and said second node, said second line comprising a zener diode, an opto coupler comprising an LED diode, a diode and a resistor, each being arranged in series;

wherein said first line and said second line are coupled in parallel between said first node and said second node and wherein the elements of said second line are in an order opposite to the order of the elements of said first line.

2. The AC input cell of claim 1, wherein the opto coupler of said first line further comprises a further resistor arranged in parallel to the LED diode and the opto coupler of said second line further comprises a further resistor arranged in parallel to the LED diode.

3. The AC input cell of claim 1, wherein at least one of the lines further comprises a buffer stage coupled to said optocoupler and comprising a transistor.

4. An AC input cell, comprising:

a first line, said first line comprising a zener diode, an opto coupler comprising an LED diode, a diode and a resistor, each being arranged in series, a second line, said second line comprising a zener diode, an opto coupler comprising an LED diode, a diode and a resistor, each being arranged in series, wherein said first line and said second line are coupled in series and wherein the elements of said second line are in an order opposite to the order of the elements of said first line.

5. The AC input cell of claim 4, wherein another resistor is arranged in parallel to the LED diode of each of the optocouplers to limit any leakage current of the zener diode.

6. The AC input cell of claim 4, wherein at least one of the lines further comprises a buffer stage coupled to said optocoupler and comprising a transistor.

* * * * *